US012781348B2

(12) United States Patent
Inada et al.

(10) Patent No.: US 12,781,348 B2
(45) Date of Patent: Nov. 3, 2026

(54) SUBSTRATE PROCESSING APPARATUS, METHOD OF MANUFACTURING SEMICONDUCTOR DEVICE AND NON-TRANSITORY COMPUTER-READABLE RECORDING MEDIUM

(71) Applicant: Kokusai Electric Corporation, Tokyo (JP)

(72) Inventors: Tetsuaki Inada, Toyama (JP); Junya Konishi, Toyama (JP); Masaki Murobayashi, Toyama (JP); Takeshi Yasui, Toyama (JP); Takeo Sato, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 716 days.

(21) Appl. No.: 18/183,090

(22) Filed: Mar. 13, 2023

(65) Prior Publication Data

US 2023/0230818 A1 Jul. 20, 2023

Related U.S. Application Data

(63) Continuation of application No. PCT/JP2021/035034, filed on Sep. 24, 2021.

(30) Foreign Application Priority Data

Sep. 29, 2020 (JP) ................................ 2020-163933

(51) Int. Cl.
*H01J 37/32* (2006.01)
*C23C 16/04* (2006.01)
(Continued)

(52) U.S. Cl.
CPC ............ *C23C 16/52* (2013.01); *C23C 16/045* (2013.01); *H01J 37/321* (2013.01);
(Continued)

(58) Field of Classification Search
CPC ....... C23C 16/52; C23C 16/045; C23C 16/46; C23C 16/507; C23C 16/455;
(Continued)

(56) References Cited

U.S. PATENT DOCUMENTS 4,018,184 A * 4/1977 Nagasawa ........... H10P 14/6309
118/900
4,167,915 A * 9/1979 Toole ...................... C30B 29/06
219/390
(Continued)

FOREIGN PATENT DOCUMENTS

JP 2010-045195 A 2/2010
JP 2010-283331 A 12/2010
(Continued)

OTHER PUBLICATIONS

Japanese Office Action issued on Jan. 4, 2024 for Japanese Patent Application No. 2022-553893.
(Continued)

*Primary Examiner* — Rudy Zervigon
(74) *Attorney, Agent, or Firm* — Volpe Koenig

(57) ABSTRACT

According to one aspect of the technique of the present disclosure, there is provided a substrate processing apparatus including: a process vessel in which a substrate is processed; an outer vessel configured to cover an outer circumference of the process vessel; a gas flow path provided between the outer vessel and the outer circumference of the process vessel; an exhaust path in communication with the gas flow path; an adjusting valve configured to be capable of adjusting a conductance of the exhaust path; a first exhaust apparatus provided on the exhaust path downstream of the adjusting valve; a pressure sensor configured to measure an inner pressure of the outer vessel; and a controller configured to be capable of adjusting an exhaust volume flow rate of the first exhaust apparatus by controlling
(Continued)

the first exhaust apparatus based on a pressure measured by the pressure sensor.

16 Claims, 7 Drawing Sheets

(51) Int. Cl.
*C23C 16/52* (2006.01)
*H10P 14/60* (2026.01)
*H10P 14/692* (2026.01)

(52) U.S. Cl.
CPC .. *H01J 37/32449* (2013.01); *H01J 37/32834* (2013.01); *H01J 37/32522* (2013.01); *H01J 37/32743* (2013.01); *H01J 2237/182* (2013.01); *H01J 2237/186* (2013.01); *H01J 2237/188* (2013.01); *H01J 2237/24585* (2013.01); *H01J 2237/334* (2013.01); *H10P 14/6309* (2026.01); *H10P 14/6319* (2026.01); *H10P 14/69215* (2026.01)

(58) Field of Classification Search
CPC .......... C23C 16/45591; C23C 16/4412; C23C 16/452; H01J 37/321; H01J 37/32449; H01J 37/32834; H01J 37/32522; H01J 37/32743; H01J 2237/182; H01J 2237/186; H01J 2237/188; H01J 2237/24585; H01J 2237/334; H01J 37/3244; H01J 37/32458; H01J 37/32724; H01J 37/32816; H01J 37/32935; H01J 37/3299; H01J 37/3211; H01J 37/32082; H01J 37/32174; H01J 37/32009; H01J 37/32018; H01J 37/32027; H01J 37/32036; H01J 37/32119; H10P 14/6309; H10P 14/6319; H10P 14/69215; H10P 14/60; H05H 1/46
USPC ....... 118/723, 1, 723 IR; 156/345.48, 345.49
See application file for complete search history.

(56) References Cited

U.S. PATENT DOCUMENTS

| | | | | |
|---|---|---|---|---|
| 4,858,557 | A * | 8/1989 | Pozzetti | C30B 25/10 118/725 |
| 5,171,525 | A * | 12/1992 | Jacob | A61L 2/14 422/906 |
| 5,364,488 | A * | 11/1994 | Minato | H01J 37/32522 118/724 |
| 5,698,168 | A * | 12/1997 | Priddy | C30B 23/066 422/906 |
| 6,835,919 | B2 * | 12/2004 | Tolmachev | H01J 37/32357 219/494 |
| 8,683,943 | B2 * | 4/2014 | Onodera | C23C 16/402 156/345.43 |
| 2010/0278999 | A1 | 11/2010 | Onodera et al. | |
| 2018/0315626 | A1 * | 11/2018 | Franklin | H10P 72/0432 |

FOREIGN PATENT DOCUMENTS

| | | | |
|---|---|---|---|
| JP | 2018-117141 | A | 7/2018 |
| KR | 100683255 | B | 2/2007 |
| WO | 2019053925 | A1 | 3/2019 |

OTHER PUBLICATIONS

ISA State Intellectual Property Office of the People's Republic of China, Office Action of the International Searching Authority Issued on Aug. 28, 2025 for Chinese Patent Application No. 2021800631365.
Korean Office Action issued on Oct. 28, 2024 for Korean Patent Application No. 10-2023-7008764.

* cited by examiner

SUBSTRATE PROCESSING APPARATUS, METHOD OF MANUFACTURING SEMICONDUCTOR DEVICE AND NON-TRANSITORY COMPUTER-READABLE RECORDING MEDIUM

CROSS-REFERENCE TO RELATED PATENT APPLICATION

This application is a bypass continuation application of PCT International Application No. PCT/JP2021/035034 filed on Sep. 24, 2021, in the WIPO, the international application being based upon and claiming the benefit of priority from Japanese Patent Application No. 2020-163933, filed on Sep. 29, 2020, in the Japanese Patent Office, the entire contents of which are hereby incorporated by reference.

BACKGROUND

1. Field

The present disclosure relates to a substrate processing apparatus, a method of manufacturing a semiconductor device and a non-transitory computer-readable recording medium.

2. Related Art

According to some related arts, in a substrate processing apparatus, there is provided a structure including: a flow path through which a temperature adjusting gas flows between a process vessel and a plasma generator; an exhaust path through which the temperature adjusting gas is discharged; and an adjusting valve (regulating valve) provided in the exhaust path. In the substrate processing apparatus described above, the temperature adjusting gas is discharged by an exhaust apparatus provided in the exhaust path or connected to an end of the exhaust path. When discharging the temperature adjusting gas, by controlling a flow rate (an exhaust volume flow rate) of the temperature adjusting gas by adjusting an opening degree of the adjusting valve in accordance with a temperature of the process vessel, the temperature of the process vessel is maintained at a predetermined temperature.

However, it may be difficult to maintain a stable exhaust volume flow rate due to factors such as temperature fluctuations in the process vessel and pressure fluctuations in the exhaust apparatus connected to the end of the exhaust path.

SUMMARY

According to the present disclosure, there is provided a technique capable of stably maintaining a temperature of a process vessel by exhausting a space around the process vessel with a stable volume flow rate.

According to one aspect of the technique of the present disclosure, there is provided a substrate processing apparatus including: a process vessel in which a substrate is processed; an outer vessel configured to cover an outer circumference of the process vessel; a gas flow path provided between the outer vessel and the outer circumference of the process vessel; an exhaust path in communication with the gas flow path; an adjusting valve configured to be capable of adjusting a conductance of the exhaust path; a first exhaust apparatus provided on the exhaust path downstream of the adjusting valve; a pressure sensor configured to measure an inner pressure of the outer vessel; and a controller configured to be capable of adjusting an exhaust volume flow rate of the first exhaust apparatus by controlling the first exhaust apparatus based on a pressure measured by the pressure sensor.

DETAILED DESCRIPTION

Figure 1:
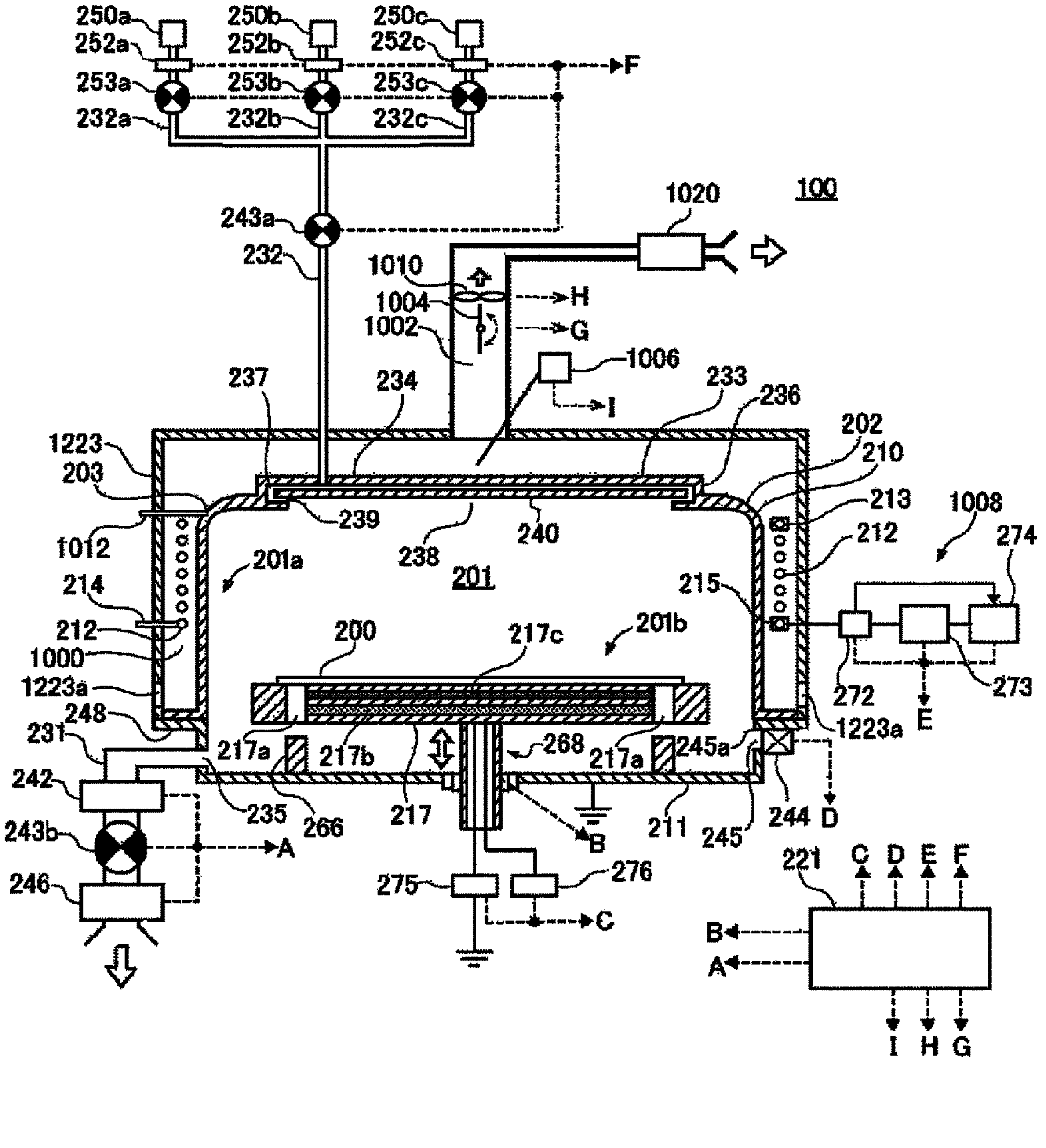
FIG. 1 is a diagram schematically illustrating a cross-section of a substrate processing apparatus according to an embodiment of the present disclosure.

Hereinafter, embodiments according to the technique of the present disclosure will be described with reference to the drawings. In the following descriptions of the embodiments, the same or similar reference numerals represent the same or similar components in the drawings, and redundant descriptions related thereto will be omitted. In addition, the drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

Embodiment of Present Disclosure (1) Configuration of Substrate Processing Apparatus Hereinafter, a configuration of a substrate processing apparatus 100 according to a first embodiment of the present disclosure will be described with reference to FIG. 1. For example, the substrate processing apparatus 100 according to the present embodiment is configured to perform a process such as an oxidation process mainly on a film formed on a surface of a substrate. The substrate processing apparatus 100 includes: a process vessel 203; a shield plate 1223 serving as an example of an outer vessel configured to cover an outer circumference of the process vessel 203; a gas flow path 1000; an exhaust path 1002; a damper 1004 serving as an example of an adjusting valve (regulating valve); a fan 1010 serving as an example of a first exhaust apparatus; a pressure sensor 1006; a controller 221 serving as a control structure; and a plasma generator 1008.

<Process Chamber>

The substrate processing apparatus 100 includes a process furnace 202 in which a wafer 200 serving as an example of the substrate is processed by using a plasma. The process furnace 202 is provided with the process vessel 203 constituting a process chamber 201. The wafer 200 serving as an example of the substrate is processed in the process vessel 203 (that is, in the process chamber 201). The process vessel 203 includes a dome-shaped upper vessel 210 serving as a first vessel and a bowl-shaped lower vessel 211 serving as a second vessel. By covering the lower vessel 211 with the upper vessel 210, the process chamber 201 is defined. For example, the upper vessel 210 is made of a non-metallic material such as aluminum oxide ($Al_2O_3$) and quartz ($SiO_2$), and the lower vessel 211 is made of a metal such as aluminum (Al).

In addition, a gate valve 244 is provided on a lower side wall of the lower vessel 211. While the gate valve 244 is open, the wafer 200 can be transferred (loaded) into the process chamber 201 through a loading/unloading port 245 using a wafer transfer structure (wafer transfer device) (not shown) or can be transferred (unloaded) out of the process chamber 201 through the loading/unloading port 245 using the wafer transfer structure. While the gate valve 244 is closed, the gate valve 244 maintains the process chamber 201 airtight.

For example, the process chamber 201 includes a plasma generation space **201*a* and a substrate processing space 201*b*. A resonance coil 212 is provided around the plasma generation space 201*a*. The substrate processing space 201*b* communicates with the plasma generation space 201*a*, and the wafer 200 is processed in the substrate processing space 201*b*. The plasma generation space 201*a* refers to a space in which the plasma is generated, for example, a space above a lower end of the resonance coil 212 and below an upper end of the resonance coil 212 in the process chamber 201. In addition, the substrate processing space 201*b* refers to a space in which the substrate (that is, the wafer 200) is processed by the plasma, for example, a space below the lower end of the resonance coil 212. According to the present embodiment, a horizontal diameter of the plasma generation space 201*a* in a horizontal direction is set to be substantially the same as a horizontal diameter of the substrate processing space 201*b*** in the horizontal direction.

<Susceptor>

A susceptor 217 serving as a part of a substrate mounting table on which the wafer 200 is placed is provided at a center of a bottom portion of the process chamber 201.

A heater **217*b* serving as a heating structure is integrally embedded in the susceptor 217. The heater 217*b* is configured to heat the wafer 200 such that a surface of the wafer 200 is heated to a temperature within a range from 25° C. to 750° C. when an electric power is supplied to the heater 217*b***.

The susceptor 217 is electrically insulated from the lower vessel 211. An impedance adjusting electrode **217*c* is provided in the susceptor 217 so as to further improve a uniformity of a density of the plasma generated on the wafer 200 placed on the susceptor 217, and is grounded via a variable impedance regulator 275** serving as an impedance adjusting structure.

A susceptor elevator 268 including a driver (which is a driving structure) capable of elevating and lowering the susceptor 217 is provided at the susceptor 217. In addition, a plurality of through-holes **217*a* are provided at the susceptor 217, and a plurality of wafer lift pins 266 are provided at a bottom surface of the lower vessel 211 at locations corresponding to the through-holes 217*a*. When the susceptor 217 is lowered by the susceptor elevator 268, the wafer lift pins 266 pass through the through-holes 217*a* without contacting the susceptor 217. The substrate mounting table according to the present embodiment is constituted mainly by the susceptor 217, the heater 217*b* and the impedance adjusting electrode 217*c***.

<Gas Supplier>

A gas supply head 236 is provided above the process chamber 201, that is, on an upper portion of the upper vessel 210. The gas supply head 236 includes a cap-shaped lid 233, a gas inlet port 234, a buffer chamber 237, an opening 238, a shield plate 240 and a gas outlet port 239. In addition, the gas supply head 236 is configured such that a gas such as a reactive gas can be supplied into the process chamber 201 through the gas supply head 236. The buffer chamber 237 functions as a dispersion space in which the reactive gas introduced (supplied) through the gas inlet port 234 is dispersed.

A downstream end of an oxygen-containing gas supply pipe **232*a* through which an oxygen-containing gas is supplied, a downstream end of a hydrogen-containing gas supply pipe 232*b* through which a hydrogen-containing gas is supplied and a downstream end of an inert gas supply pipe 232*c* through which an inert gas is supplied are connected to a gas supply pipe 232 of the gas inlet port 234 so as to be conjoined with one another. An oxygen-containing gas supply source 250*a*, a mass flow controller (MFC) 252*a* serving as a flow rate controller and a valve 253*a* serving as an opening/closing valve are sequentially provided at the oxygen-containing gas supply pipe 232*a* in this order from an upstream side to a downstream side of the oxygen-containing gas supply pipe 232*a* in a gas flow direction. A hydrogen-containing gas supply source 250*b*, an MFC 252*b* and a valve 253*b* are sequentially provided at the hydrogen-containing gas supply pipe 232*b* in this order from an upstream side to a downstream side of the hydrogen-containing gas supply pipe 232*b* in the gas flow direction. An inert gas supply source 250*c*, an MFC 252*c* and a valve 253*c* are sequentially provided at the inert gas supply pipe 232*c* in this order from an upstream side to a downstream side of the inert gas supply pipe 232*c* in the gas flow direction. A valve 243*a* is provided at the gas supply pipe 232 at a downstream side of a location where the oxygen-containing gas supply pipe 232*a*, the hydrogen-containing gas supply pipe 232*b* and the inert gas supply pipe 232*c* join. The valve 243*a* is connected to an upstream side of the gas inlet port 234. By opening and closing the valves 253*a*, 253*b*, 253*c* and 243*a*, it is possible to adjust flow rates of the oxygen-containing gas, the hydrogen-containing gas and the inert gas by the MFCs 252*a*, 252*b* and 252*c*, respectively. In addition, it is configured such that process gases such as the oxygen-containing gas, the hydrogen-containing gas and the inert gas can be supplied into the process chamber 201 through the oxygen-containing gas supply pipe 232*a*, the hydrogen-containing gas supply pipe 232*b* and the inert gas supply pipe 232*c***.

A gas supplier (which is a gas supply structure or a gas supply system) according to the present embodiment is constituted mainly by the gas supply head 236 (which is constituted by the lid 233, the gas inlet port 234, the buffer chamber 237, the opening 238, the shield plate 240 and the gas outlet port 239), the oxygen-containing gas supply pipe 232*a*, the hydrogen-containing gas supply pipe 232*b*, the inert gas supply pipe 232*c*, the MFCs 252*a*, 252*b* and 252*c*, the valves 253*a*, 253*b*, 253*c* and 243*a*.

Further, an oxygen-containing gas supplier (which is an oxygen-containing gas supply structure or an oxygen-containing gas supply system) according to the present embodiment is constituted mainly by the gas supply head 236, the oxygen-containing gas supply pipe 232*a*, the MFC 252*a* and the valves 253*a* and 243*a*. In addition, a hydrogen-containing gas supplier (which is a hydrogen-containing gas supply structure or a hydrogen-containing gas supply system) according to the present embodiment is constituted mainly by the gas supply head 236, the hydrogen-containing gas supply pipe 232*b*, the MFC 252*b* and the valves 253*b* and 243*a*. In addition, an inert gas supplier (which is an inert gas supply structure or an inert gas supply system) according to the present embodiment is constituted mainly by the gas supply head 236, the inert gas supply pipe 232*c*, the MFC 252*c* and the valves 253*c* and 243*a*.

<Exhauster>

A gas exhaust port 235 through which the reactive gas is exhausted from an inside of the process chamber 201 is provided on the lower side wall of the lower vessel 211. An upstream end of a gas exhaust pipe 231 is connected to the gas exhaust port 235. An APC (Automatic Pressure Controller) valve 242 serving as a pressure regulator (pressure adjusting structure), a valve 243*b* serving as an opening/closing valve and a vacuum pump 246 serving as a vacuum exhaust apparatus are sequentially provided at the gas exhaust pipe 231 in this order from an upstream side to a downstream side of the gas exhaust pipe 231 in the gas flow direction. An exhauster (which is an exhaust structure or an exhaust system) according to the present embodiment is constituted mainly by the gas exhaust port 235, the gas exhaust pipe 231, the APC valve 242 and the valve 243*b*. The exhauster may further include the vacuum pump 246.

<Plasma Generator>

The plasma generator (which is a plasma generating structure) 1008 is constituted by the resonance coil 212 (which serves as an electrode to which a high frequency power is supplied) provided along the outer circumference of the process vessel 203 between the shield plate 1223 serving as an example of the outer vessel and the outer circumference of the process vessel 203. The plasma generator 1008 is configured to plasma-excite the gas supplied into the process vessel 203.

The resonance coil 212 of a helical shape is provided around an outer periphery of the process chamber 201, that is, around an outer portion of a side wall of the upper vessel 210 so as to surround the process chamber 201. The resonance coil 212 serves as a first electrode. An RF (Radio Frequency) sensor 272, a high frequency power supply 273 and a matcher (which is a matching structure) 274 are connected to the resonance coil 212. The matcher 274 is configured to perform an impedance matching or an output frequency matching for the high frequency power supply 273.

The high frequency power supply 273 is configured to supply the high frequency power (RF power) to the resonance coil 212. The RF sensor 272 is provided at an output side of the high frequency power supply 273. The RF sensor 272 is configured to monitor information of a traveling wave or reflected wave of the high frequency power supplied from the high frequency power supply 273. The power of the reflected wave monitored by the RF sensor 272 is input to the matcher 274, and the matcher 274 is configured to control (or adjust) an impedance of the high frequency power supply 273 or a frequency of the high frequency power output from the high frequency power supply 273 so as to minimize the reflected wave based on the information of the reflected wave input from the RF sensor 272.

The high frequency power supply 273 includes a power supply controller (which is a control circuit) (not shown) and an amplifier (which is an output circuit) (not shown). The power supply controller includes a high frequency oscillation circuit (not shown) and a preamplifier (not shown) in order to adjust an oscillation frequency and an output. The amplifier amplifies the output to a predetermined output level. The power supply controller controls the amplifier based on output conditions relating to the frequency and the power, which are set in advance through an operation panel (not shown). The amplifier supplies a constant high frequency power to the resonance coil 212 via a transmission line.

A winding diameter, a winding pitch and the number of winding turns of the resonance coil 212 are set such that the resonance coil 212 resonates at a constant wavelength to form a standing wave of a predetermined wavelength. That is, an electrical length of the resonance coil 212 is set to an integral multiple (1 time, 2 times, or so on) of a wavelength of a predetermined frequency of the high frequency power supplied from the high frequency power supply 273.

Specifically, considering conditions such as the power to be applied, a strength of a magnetic field to be generated and a shape of an apparatus such as the substrate processing apparatus 100 to which the power is to be applied, the resonance coil 212 whose diameter is within a range from 200 mm to 500 mm is wound, for example, twice to 60 times around an outer circumference of a room constituting the plasma generation space 201*a* such that the magnetic field can be generated by the high frequency power, whose frequency is within a range from 800 kHz to 50 MHz and whose power is within a range from 0.5 KW to 5 KW, being applied to the resonance coil 212.

For example, a metal such as copper and aluminum may be used as a material constituting the resonance coil 212. The resonance coil 212 of a flat plate shape is made of an insulating material, and is supported by a plurality of supports (not shown) vertically installed on an upper end surface of a base plate 248.

The shield plate 1223 is provided to shield its inside from an electric field outside of the resonance coil 212 and to form a capacitive component (also referred to as a "C component") of the resonance coil 212 appropriate for constructing a resonance circuit between the shield plate 1223 and the resonance coil 212. In general, the shield plate 1223 is made of a conductive material such as an aluminum alloy, and is of a cylindrical shape. The shield plate 1223 is disposed, for example, about 5 mm to 150 mm apart from an outer circumference of the resonance coil 212.

The plasma generator 1008 according to the present embodiment is constituted mainly by the resonance coil 212, the RF sensor 272 and the matcher 274. In addition, the plasma generator 1008 may further include the high frequency power supply 273.

Further, the gas flow path 1000 is provided between the shield plate 1223 and the outer circumference of the process vessel 203. According to the present embodiment, the shield plate 1223 covers an upper portion of the process vessel 203 and constitutes the outer vessel configured to accommodate the process vessel 203. A ceiling portion of the shield plate 1223 and the lid 233 of the process vessel 203 are separated from each other in the vertical direction, and a space therebetween also serves as the gas flow path 1000. Alternatively, as a configuration in which the shield plate 1223 does not cover the upper portion of the process vessel 203, an outer container (not shown) configured to cover the shield plate 1223 and the process vessel 203 may be further provided.

<Gas Introduction Port>

A gas introduction port 1223*a* through which a cooling gas (that is, a temperature adjusting gas) is introduced (or supplied) into the gas flow path 1000 is provided at the shield plate 1223 configured to cover a side surface of the process vessel 203. It is preferable that a plurality of gas introduction ports including the gas introduction port 1223*a* is provided at an equal interval along a circumferential direction of the process vessel 203 in the vicinity of locations facing a lower end of the process vessel 203 (that is, a lower end of the shield plate 1223 according to the present embodiment). Further, a shape of the gas introduction port 1223*a* is not limited to a circular shape or a rectangular shape. For example, the gas introduction port 1223*a* may be configured by one or more slits provided along the circumferential direction of the process vessel 203. The gas introduced into the gas flow path 1000 may be an air taken from an air atmosphere (outer atmosphere) or may be another gas (for example, the inert gas).

<Exhaust Path>

The exhaust path 1002 is in communication with the gas flow path 1000. For example, the exhaust path 1002 is connected to the ceiling portion of the shield plate 1223 and a blower 1020 serving as an example of a second exhaust apparatus. When the process vessel 203 is of a cylindrical shape, for example, in order to uniformly exhaust the gas flow path 1000 provided on the outer circumference of the process vessel 203 in the circumferential direction of the process vessel 203, the exhaust path 1002 is preferably connected to a center of the ceiling portion of the shield plate 1223. The blower 1020 is a common exhaust equipment provided in facilities such as factories, and is responsible for exhaust for those various facilities. For example, the blower 1020 is configured to be open to the air atmosphere so as to exhaust a gas out of the gas flow path 1000 to the air atmosphere.

<Pressure Sensor>

The pressure sensor 1006 refers to a sensor provided at an inner side of the shield plate 1223 serving as the outer vessel, and is configured to measure a pressure of the inner side of the shield plate 1223. That is, the pressure sensor 1006 refers to a sensor configured to measure an inner pressure of the gas flow path 1000 (or an inner pressure of the shield plate 1223 serving as the outer vessel). As shown in FIG. 1, when the exhaust path 1002 is connected to an upper surface of the shield plate 1223, the pressure sensor 1006 may be provided vertically below the exhaust path 1002 within the shield plate 1223. In other words, the pressure sensor 1006 is provided at a connecting portion (a space vertically below the exhaust path 1002 and above the process vessel 203) between the gas flow path 1000 and the exhaust path 1002.

Further, an arrangement of the pressure sensor 1006 is not limited to thereto. For example, the pressure sensor 1006 may be provided at another portion (which is different from the connecting portion) at the inner side of the shield plate 1223. When the pressure sensor 1006 is provided at the inner side of the shield plate 1223 serving as the outer vessel, the pressure sensor 1006 is less likely to be affected by a turbulence generated before and after the damper 1004.

As will be described later, the controller 221 calculates and acquires a differential pressure (in other words, a gauge pressure) between the inner pressure of the gas flow path 1000 measured by the pressure sensor 1006 and an atmospheric pressure. Then, the controller 221 controls the fan 1010 such that the differential pressure is adjusted to a predetermined differential pressure value. As the atmospheric pressure, a constant value may be used, or a measured numerical value may be used. The differential pressure corresponds to an exhaust volume flow rate in the gas flow path 1000. By setting the predetermined differential pressure value to a predetermined value at which the exhaust volume flow rate in the gas flow path 1000 reaches a desired volume flow rate, it is possible to control the exhaust volume flow rate in the gas flow path 1000 to be equal to the desired volume flow rate. That is, the differential pressure is controlled to be the predetermined differential pressure value corresponding to the desired exhaust volume flow rate in the gas flow path 1000.

<Damper>

For example, the damper 1004 serving as an example of the adjusting valve may include a butterfly valve, and is configured to be capable of adjusting a conductance (a degree of effectiveness of an exhaust flow) of the exhaust path 1002. The adjusting valve may also be referred to as a "conductance adjusting structure".

<Fan>

For example, the fan 1010 serving as an example of the first exhaust apparatus may include an axial fan, and is provided on the exhaust path 1002 downstream of the damper 1004. In the example shown in FIG. 1, the fan 1010 is provided in the vicinity of a downstream side of the damper 1004 on the exhaust path 1002. A rotation of the fan 1010 is inverter-controlled by the controller 221.

Figure 4:
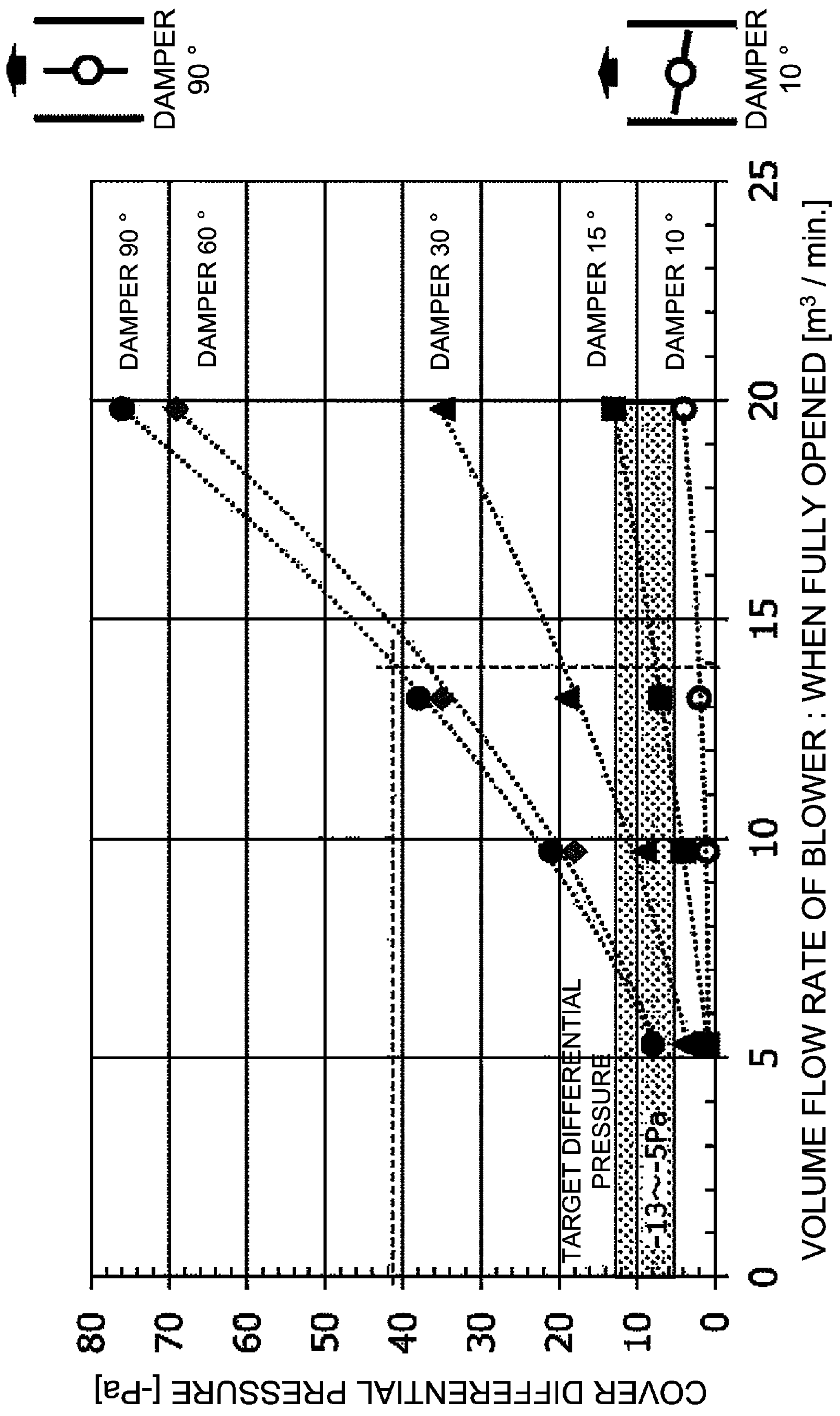
FIG. 4 is a diagram schematically illustrating a relationship between a volume flow rate of a second exhaust apparatus and a cover differential pressure according to an opening degree of a damper.

A predetermined opening degree is set for the damper 1004 in accordance with the predetermined differential pressure value. Hereinafter, a method of determining an opening degree of the damper 1004 will be described. FIG. 4 is a diagram schematically illustrating a relationship between a volume flow rate of the blower 1020 serving as the second exhaust apparatus and a cover differential pressure (that is, the differential pressure between the pressure measured by the pressure sensor 1006 and the atmospheric pressure) according to the opening degree of the damper 1004. The opening degree of the damper 1004 is 0° when fully closed and 90° when fully opened. A horizontal axis shown in FIG. 4 indicates the volume flow rate of the blower 1020, more accurately, the volume flow rate of the blower 1020 when the damper 1004 is fully opened (that is, when the opening degree of the damper 1004 is 90)°. Further, in FIG. 4, the predetermined differential pressure value is indicated by a "target differential pressure".

In a region where the volume flow rate of the blower 1020 is relatively small, even when the opening degree of the damper 1004 changes, a change in the cover differential pressure is relatively small. As the volume flow rate of the blower 1020 increases, the change in the cover differential pressure due to the change in the opening degree of the damper 1004 also increases. Thereby, it can be seen that, in a region where the volume flow rate of the blower 1020 is large, the cover differential pressure is difficult to fine-tune only by adjusting the opening degree of the damper 1004.

In the present embodiment, as indicated by a dotted portion in FIG. 4, for example, the target differential pressure (predetermined differential pressure) is set to a value within a range from −13 Pa to −5 Pa. In such a case, by setting the opening degree of the damper 1004 to 15°, it is possible to obtain the target differential pressure (predetermined differential pressure) when the volume flow rate of the blower 1020 is set to a value within a range from approximately 11 $m^3$/minute to 20 $m^3$/minute. Further, for example, when the opening degree of the damper 1004 is set to 90° and the volume flow rate of the blower 1020 is set to about 14 $m^3$/minute, the cover differential pressure is about −42 Pa. In a case where the cover differential pressure is set to the target differential pressure (predetermined differential pressure) while minimizing a change range of the volume flow rate of the blower 1020, it is preferable to set the opening degree of the damper 1004 to a value about 15°.

Figure 5:
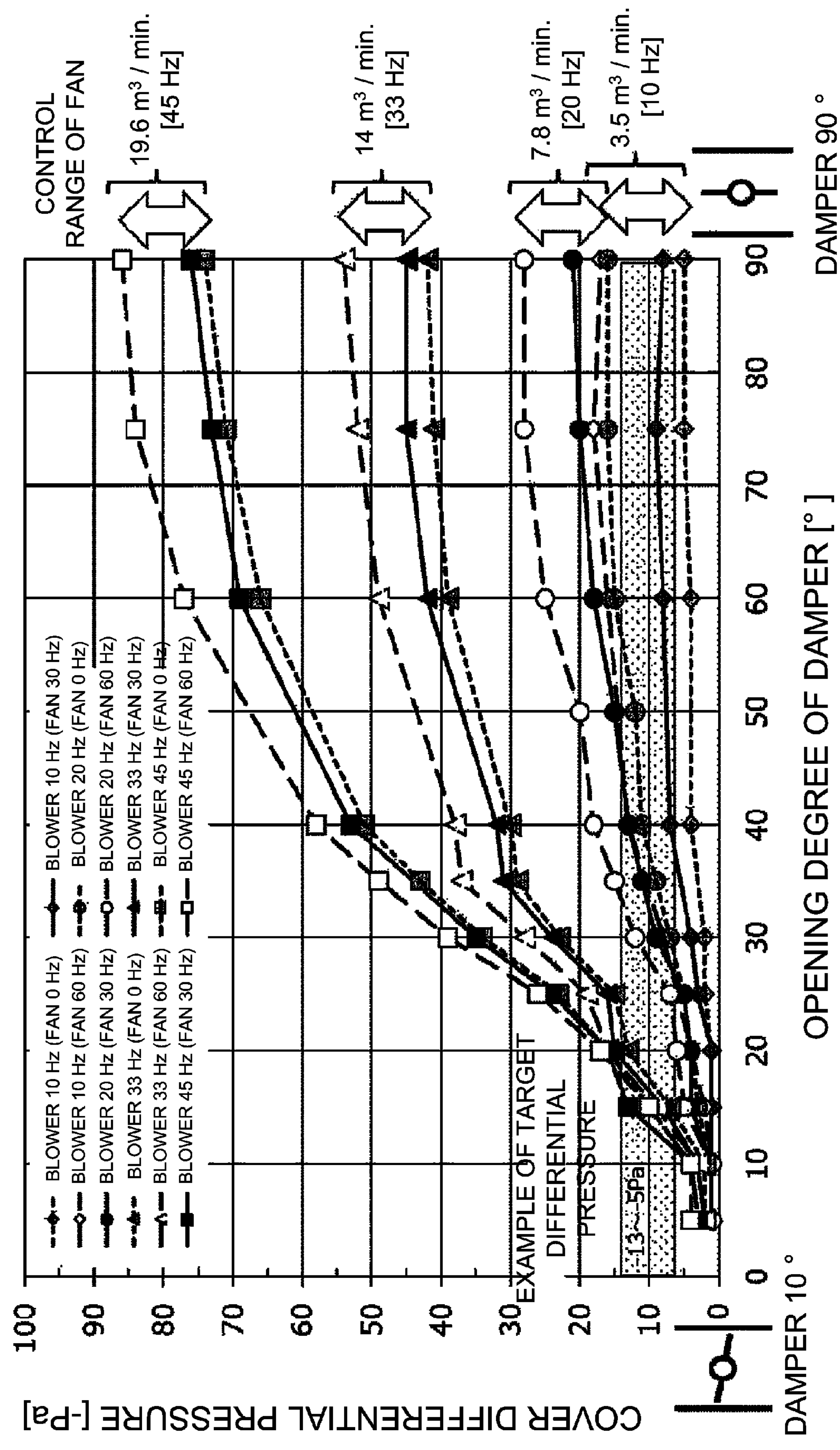
FIG. 5 is a diagram schematically illustrating a relationship between the opening degree of the damper and the cover differential pressure according to operating frequencies of a first exhaust apparatus (fan) and the second exhaust apparatus (blower).

Further, a predetermined opening degree may be set for the damper 1004 in accordance with the predetermined differential pressure value and the exhaust volume flow rate of the blower 1020. FIG. 5 is a diagram schematically illustrating a relationship between the opening degree of the damper 1004 and the cover differential pressure according to operating frequencies of the fan 1010 and the blower 1020. A magnitude of each operating frequency means a magnitude of an output thereof. Lines shown in FIG. 5 are divided into four groups. The lowest group refers to a group in which the operating frequency of the blower 1020 is 10 Hz. The second lowest group from the bottom refers to a group in which the operating frequency of the blower 1020 is 20 Hz. The third lowest group from the bottom refers to a group in which the operating frequency of the blower 1020 is 33 Hz. The fourth lowest group from the bottom, that is, the highest group located at the top refers to a group in which the operating frequency of the blower 1020 is 45 Hz. The operating frequency of the fan 1010 is 0 Hz, 30 Hz or 60 Hz.

A range between the lowermost line (a case in which the operating frequency of the fan 1010 is 0 Hz) and the uppermost line (a case in which the operating frequency of the fan 1010 is 60 Hz) among three lines in each group represents a controllable range of the cover differential pressure by the fan 1010. In each group, even when the volume flow rate (output) of the blower 1020 fluctuates slightly in a state where the opening degree of the damper 1004 is predetermined, it is possible to suppress the fluctuation of the cover differential pressure by controlling the fan 1010. Specifically, when the volume flow rate (output) of the blower 1020 decreases, the fan 1010 is controlled such that the volume flow rate (output) of the fan 1010 increases, and when the volume flow rate (output) of the blower 1020 increases, the fan 1010 is controlled such that the volume flow rate (output) of the fan 1010 decreases.

In a case where the target differential pressure (predetermined differential pressure) is, for example, within a range from −13 Pa to −5 Pa, when the operating frequency of the blower 1020 is 10 Hz, by setting the opening degree of the damper 1004, for example, to approximately 75°, the target differential pressure (predetermined differential pressure) falls within a control range (that is, the controllable range) of the fan 1010. Similarly, when the operating frequency of the blower 1020 is 20 Hz, by setting the opening degree of the damper 1004, for example, to approximately 30°, the target differential pressure (predetermined differential pressure) falls within the control range of the fan 1010. When the output of the blower 1020 is small, a degree of freedom for the opening degree of damper 1004 increases.

As described above, the lowermost line in each group indicates a case where the operating frequency of the fan 1010 is 0 Hz, that is, the fan 1010 is not operated. For example, in the group in which the operating frequency of the blower 1020 is 45 Hz, when the opening degree of the damper 1004 is 40° and the operating frequency of the fan 1010 is 0 Hz, the cover differential pressure is about −50 Pa. In a case where the target differential pressure (predetermined differential pressure) is −50 Pa, the target differential pressure (predetermined differential pressure) goes beyond the control range of the fan 1010 when the volume flow rate of the blower 1020 decreases and the cover differential pressure decreases. Therefore, the opening degree of the damper 1004 is set to a value smaller than 40° (such as about 38°) at which the differential pressure is smaller than the target differential pressure (predetermined differential pressure) of −50 Pa. Thereby, the target differential pressure (predetermined differential pressure) falls within the control range of the fan 1010, that is, the range between the lowermost line and the uppermost line.

Thus, the predetermined opening degree of the damper 1004 may be set to be smaller than the value at which the differential pressure between the pressure measured by the pressure sensor 1006 when the fan 1010 is not operated and the atmospheric pressure reaches the predetermined differential pressure value.

The substrate processing apparatus 100 may further include a temperature sensor 1012 configured to measure a temperature of the process vessel 203. In such a case, the predetermined differential pressure may be set based on the temperature measured by the temperature sensor 1012.

The opening degree of the damper 1004 may be set manually, or may be controlled by the controller 221 and an actuator (not shown). That is, the controller 221 may control the fan 1010 and the damper 1004 or may control the fan 1010 alone.

<Controller>

The controller 221 serving as the control structure is configured to be capable of controlling: the APC valve 242, the valve 243*b* and the vacuum pump 246 through a signal line “A”; the susceptor elevator 268 through a signal line “B”; a heater power regulator 276 and the variable impedance regulator 275 through a signal line “C”; the gate valve 244 through a signal line “D”; the RF sensor 272, the high frequency power supply 273 and the matcher 274 through a signal line “E”; and the MFCs 252*a*, 252*b* and 252*c* and the valves 253*a*, 253*b*, 253*c* and 243*a* through a signal line “F”.

Figure 2:
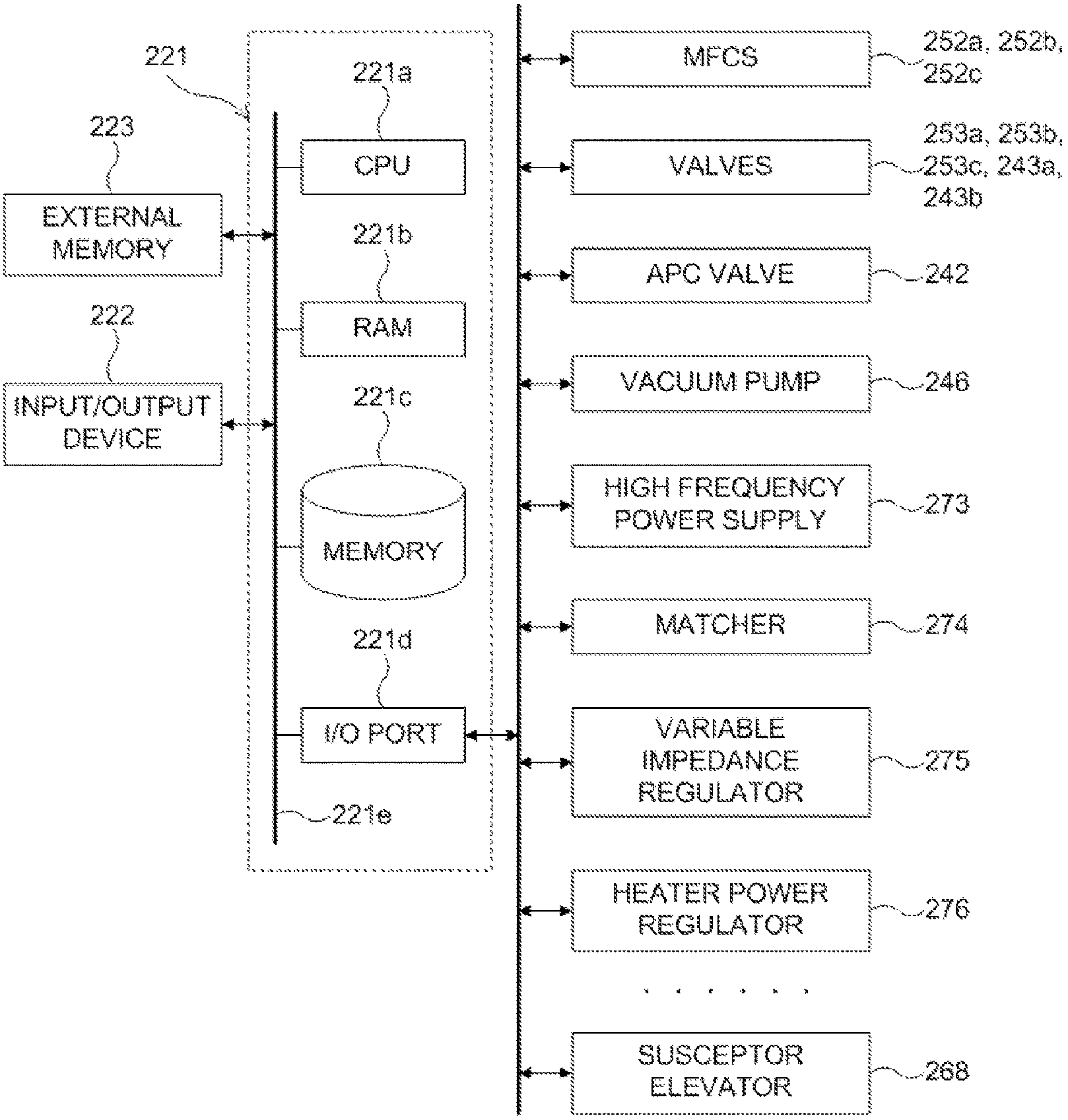
FIG. 2 is a block diagram schematically illustrating a configuration of a controller (control structure) and related components of the substrate processing apparatus according to the embodiment of the present disclosure.

As shown in FIG. 2, the controller 221 serving as the control structure (control apparatus) is constituted by a computer including a CPU (Central Processing Unit) 221*a*, a RAM (Random Access Memory) 221*b*, a memory 221*c* and an I/O port 221*d*. The RAM 221*b*, the memory 221*c* and the I/O port 221*d* may exchange data with the CPU 221*a* through an internal bus 221*e*. For example, an input/output device 222 constituted by components such as a touch panel and a display may be connected to the controller 221.

The memory 221*c* may be embodied by a component such as a flash memory, a hard disk drive (HDD) and a solid state drive (SSD). For example, a control program configured to control operations of the substrate processing apparatus 100 and a process recipe in which information such as sequences and conditions of a substrate processing described later is stored may be readably stored in the memory 221*c*. The process recipe is obtained by combining steps of the substrate processing described later such that the controller 221 can execute the steps by the substrate processing apparatus 100 to acquire a predetermined result, and functions as a program. Hereinafter, the process recipe and the control program may be collectively or individually referred to as a “program”. Thus, in the present specification, the term “program” may refer to the process recipe alone, may refer to the control program alone, or may refer to both of the process recipe and the control program. Further, the RAM 221*b* functions as a memory area (work area) where a program or data read by the CPU 221*a* is temporarily stored.

The I/O port 221*d* is electrically connected to the components described above such as the MFCs 252*a*, 252*b* and 252*c*, the valves 253*a*, 253*b* and 253*c*, 243*a* and 243*b*, the gate valve 244, the APC valve 242, the vacuum pump 246, the RF sensor 272, the high frequency power supply 273, the matcher 274, the susceptor elevator 268, the variable impedance regulator 275 and the heater power regulator 276.

The CPU 221*a* is configured to read and execute the control program stored in the memory 221*c*, and to read the process recipe stored in the memory 221*c* in accordance with an instruction such as an operation command inputted via the input/output device 222. The CPU 221*a* is configured to control the operations of the substrate processing apparatus 100 in accordance with the read process recipe. For example, the CPU 221*a* is configured to be capable of controlling various operations, in accordance with the process recipe, such as an operation of adjusting an opening degree of the APC valve 242, an opening and closing operation of the valve 243*b* and a start and stop of the vacuum pump 246 via the I/O port 221*d* and the signal line "A". Further, the CPU 221*a* is configured to be capable of controlling various operations, in accordance with the process recipe, such as an elevating and lowering operation of the susceptor elevator 268 via the I/O port 221*d* and the signal line "B". Further, the CPU 221*a* is configured to be capable of controlling various operations, in accordance with the process recipe, such as a power supply amount (temperature) adjusting operation to the heater 217*b* by the heater power regulator 276 and an impedance value adjusting operation by the variable impedance regulator 275 via the I/O port 221*d* and the signal line "C". Further, the CPU 221*a* is configured to be capable of controlling various operations, in accordance with the process recipe, such as an opening and closing operation of the gate valve 244 via the I/O port 221*d* and the signal line "D". Further, the CPU 221*a* is configured to be capable of controlling various operations, in accordance with the process recipe, such as controlling operations for the RF sensor 272, the matcher 274 and the high frequency power supply 273 via the I/O port 221*d* and the signal line "E". Further, the CPU 221*a* is configured to be capable of controlling various operations, in accordance with the process recipe, such as flow rate adjusting operations for various gases by the MFCs 252*a*, 252*b* and 252*c* and opening and closing operations of the valves 253*a*, 253*b* and 253*c*, 243*a* and 243*b* via the I/O port 221*d* and the signal line "F".

The controller 221 may be embodied by installing the above-described program stored in an external memory 223 into the computer. For example, the external memory 223 may include a magnetic tape, a magnetic disk such as a flexible disk and a hard disk, an optical disk such as a CD and a DVD, a magneto-optical disk such as an MO and a semiconductor memory such as a USB memory and the SSD. The memory 221*c* or the external memory 223 may be embodied by a non-transitory computer readable recording medium. Hereafter, the memory 221*c* and the external memory 223 may be collectively or individually referred to as a "recording medium". Thus, in the present specification, the term "recording medium" may refer to the memory 221*c* alone, may refer to the external memory 223 alone, or may refer to both of the memory 221*c* and the external memory 223. The program may be provided to the computer without using the external memory 223. For example, the program may be supplied to the computer using a communication structure such as the Internet and a dedicated line.

Further, the controller 221 is configured to be capable of controlling the fan 1010 so as to control (or adjust) the exhaust volume flow rate of the fan 1010 based on the pressure measured by the pressure sensor 1006. Further, the controller 221 is configured to be capable of controlling the fan 1010 such that the differential pressure between the pressure measured by the pressure sensor 1006 and the atmospheric pressure is adjusted to the predetermined differential pressure value.

Further, as described above, the substrate processing apparatus 100 may further include the temperature sensor 1012 configured to measure the temperature of the process vessel 203. In such a case, the controller 221 is further configured to be capable of controlling the fan 1010 such that the differential pressure between the pressure measured by the pressure sensor 1006 and the atmospheric pressure is adjusted to the predetermined differential pressure value (which is set based on the temperature measured by temperature sensor 1012).

The opening degree of the damper 1004 may be set manually. Further, the opening degree of the damper 1004 may be controlled by the controller 221 and the actuator (not shown). In such a case, for example, the controller 221 may include: an input device (that is, the input/output device 222) capable of receiving an input of the predetermined differential pressure value and the volume flow rate of the blower 1020; and a table (that is, the RAM 221*b* and the memory 221*c*) storing information on the predetermined opening degree according to the differential pressure value and the volume flow rate of the blower 1020. The controller 221 is further configured to be capable of acquiring the information on the opening degree according to the predetermined differential pressure value and the volume flow rate of the blower 1020 from the table of the controller 221, and to be capable of controlling the opening degree of the damper 1004 based on the acquired information on the opening degree.

<Actions (Effects)>

According to the present embodiment, even when the temperature of the process vessel 203 or the pressure fluctuates in the blower 1020 connected to the end of the exhaust path 1002, it is possible to stably maintain the temperature of the process vessel 203 by exhausting a space around the process vessel 203 with a stable volume flow rate (that is, by exhausting the gas introduced into the space around the process vessel 203 through the gas introduction port 1223*a*). Specifically, by compensating for pressure fluctuations in the blower 1020 by the fan 1010, it is possible to stably maintain the exhaust volume flow rate.

Thereby, it is possible to improve the yield of a semiconductor such as the wafer 200. In addition, by controlling the volume flow rate, it is possible to adjust (or control) the temperature of the process vessel 203, and it is also possible to provide an apparatus with a small machine difference as a temperature adjusting knob in addition to the heating structure.

Further, since the pressure sensor 1006 is provided not in the exhaust path 1002 but in the shield plate 1223 serving as the outer vessel, the pressure sensor 1006 is less likely to be affected by the turbulence generated when the opening degree of the damper 1004 is changed. Thereby, it is possible to stably measure the pressure.

Even when the temperature sensor 1012 is provided in the process vessel 203, it is possible to monitor the temperature of the process vessel 203. Since the temperature of the process vessel 203 is related to the temperature of the wafer 200, by making it possible to change the volume flow rate by the fan 1010 and the damper 1004, it is possible to control the temperature of the process vessel 203.

In addition to being influenced by the exhaust volume flow rate in the gas flow path 1000, the temperature of the process vessel 203 may also fluctuate depending on other factors such as an output of the heater 217*b* and a plasma intensity generated in the process vessel 203. Therefore, for example, in a case where the temperature of the process vessel 203 is monitored and a feed-back control is performed for one or both of the fan 1010 and the damper 1004 such that the temperature of the process vessel 203 measured by the temperature sensor 1012 is adjusted to a predetermined temperature, the volume flow rate may frequently fluctuate according to the fluctuation of the temperature of the process vessel 203. Thereby, it may be difficult to stabilize the temperature of the process vessel 203. Therefore, from a viewpoint of emphasizing a stability of the temperature of the process vessel 203, it is preferable to control one or both of the fan 1010 and the damper 1004 based on a predetermined volume flow rate independent of the temperature of the process vessel 203 measured by the temperature sensor 1012.

Figure 6:
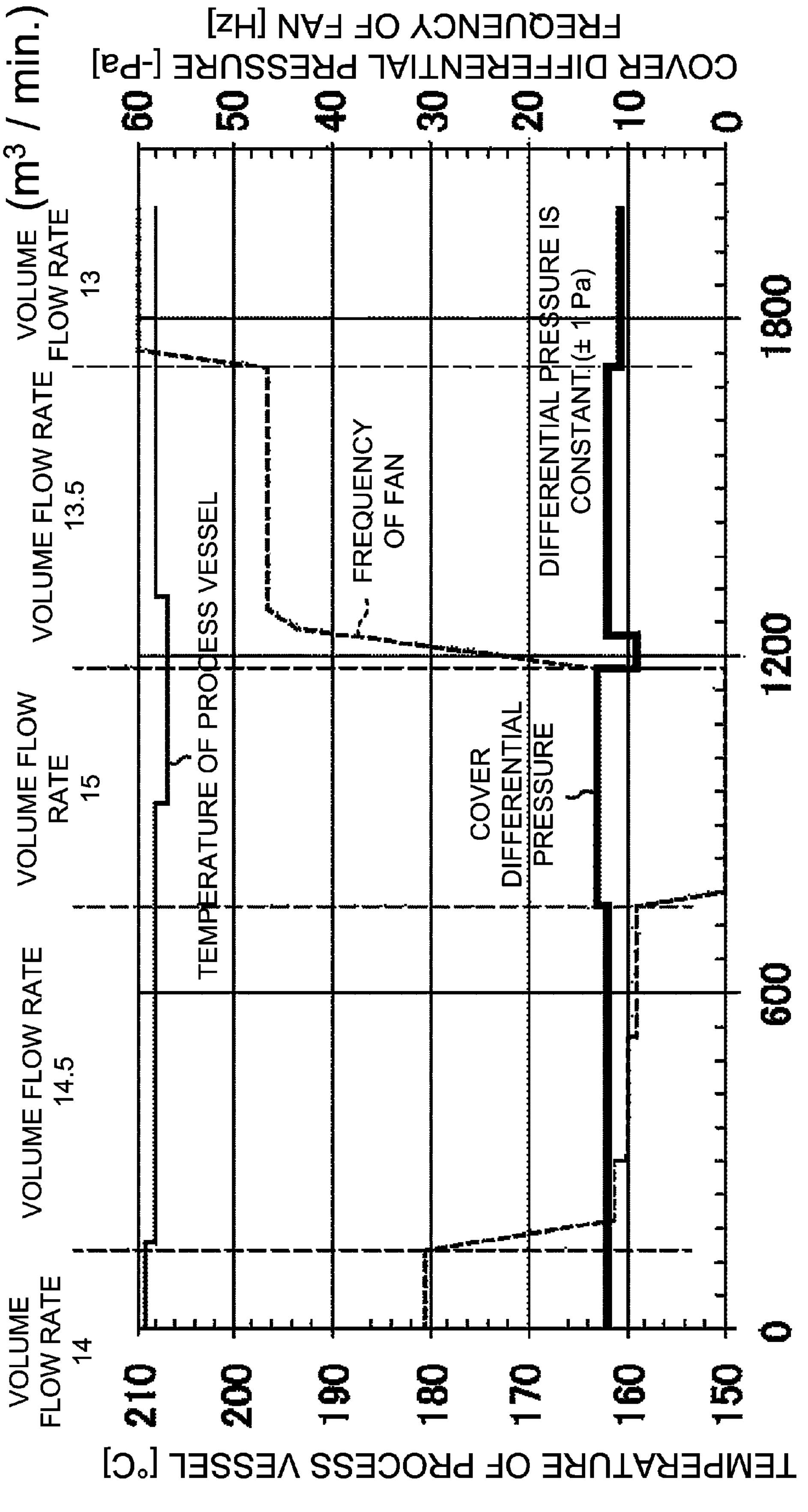
FIG. 6 is a diagram schematically illustrating changes in the cover differential pressure, the operating frequency of the first exhaust apparatus (fan) and a temperature of a process vessel when the volume flow rate of the second exhaust apparatus (blower) fluctuates.

FIG. 6 is a diagram schematically illustrating changes in the differential pressure, the operating frequency of the first exhaust apparatus (that is, the fan 1010) and the temperature of the process vessel 203 when the volume flow rate of the second exhaust apparatus (that is, the blower 1020) fluctuates, for example, between 13 $m^3$/minute and 15 $m^3$/minute. In FIG. 6, a dashed line indicates the operating frequency of the fan 1010, a solid line (thick line) indicates the cover differential pressure, and a solid line (thin line) indicates the temperature of an outer peripheral surface of the process vessel 203 measured by the temperature sensor 1012. When the volume flow rate of the blower 1020 is increased by the controller 221, the operating frequency of the fan 1010 is decreased, and when the volume flow rate of the blower 1020 is decreased by the controller 221, the operating frequency of the fan 1010 is increased. Thereby, it is possible to maintain the differential pressure substantially constant (+1 Pa), and it is also possible to maintain the temperature of the process vessel 203 substantially constant.

Figure 7:
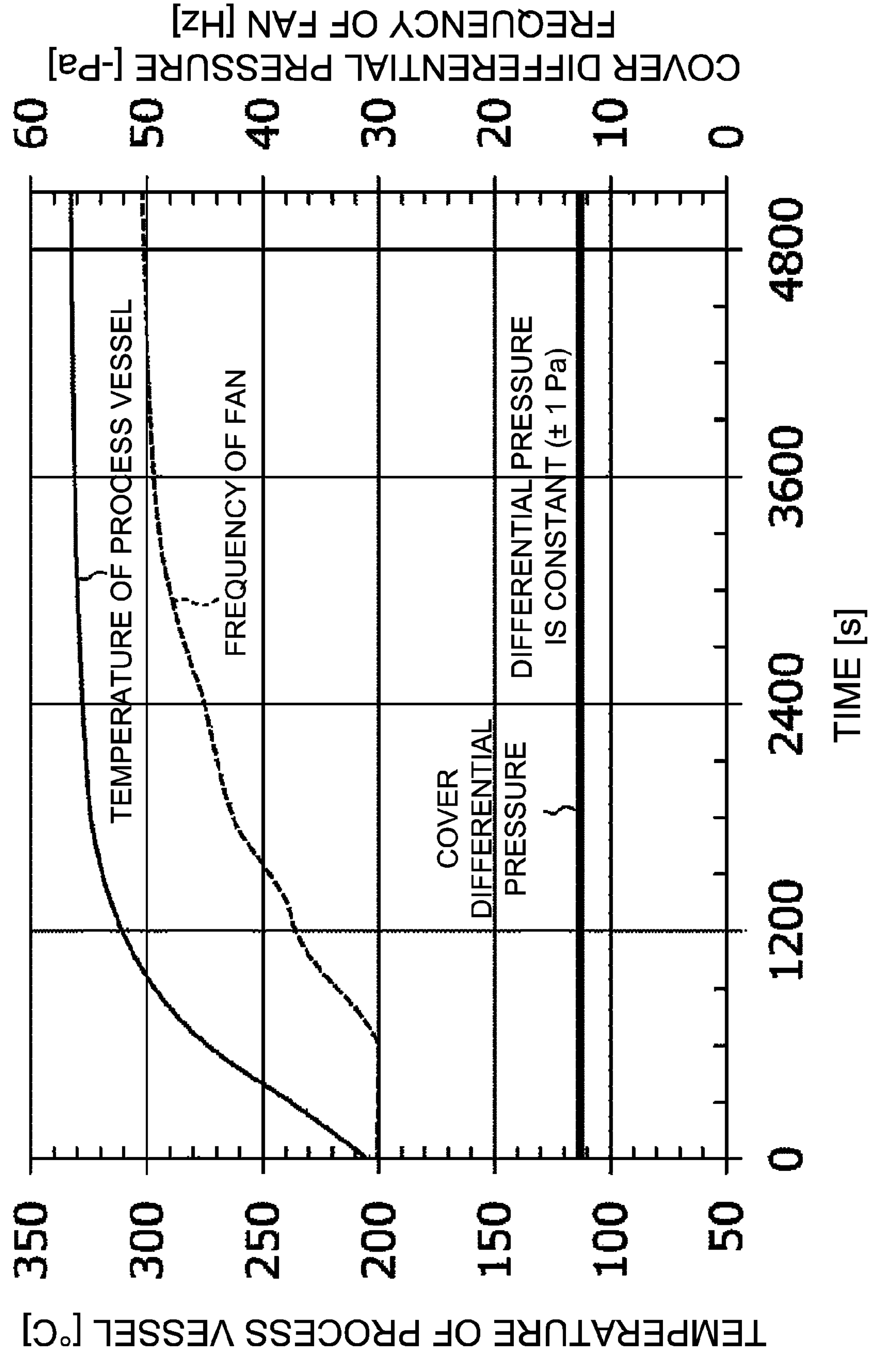
FIG. 7 is a diagram schematically illustrating changes in the cover differential pressure, the operating frequency of the first exhaust apparatus (fan) and the temperature of the process vessel when the high frequency power is continuously discharged in a plasma generator.

FIG. 7 is a diagram schematically illustrating changes in the differential pressure, the operating frequency of the first exhaust apparatus (that is, the fan 1010) and the temperature of the process vessel 203 when the high frequency is continuously discharged at the output of 5 KW for 80 minutes in the plasma generator 1008. In FIG. 7, a dashed line indicates the operating frequency of the fan 1010, a solid line (thick line) indicates the cover differential pressure, and a solid line (thin line) indicates the temperature of the outer peripheral surface of the process vessel 203 measured by the temperature sensor 1012. When the temperature of the process vessel 203 is elevated, since the inner pressure of the shield plate 1223 serving as the outer vessel also increases and the differential pressure in reference to the atmospheric pressure decreases, the operating frequency (output) of the fan 1010 fluctuates. Thereby, it is possible to maintain the differential pressure substantially constant (+1 Pa). Thus, even when the inner pressure of the shield plate 1223 changes due to the temperature change, it is possible to maintain the differential pressure substantially constant.

As described above, according to the present embodiment, even when the temperature of the process vessel 203 fluctuates or the pressure of the blower 1020 connected to the end of the exhaust path 1002 fluctuates, it is possible to stably maintain the temperature of the process vessel 203 by exhausting the space around the process vessel 203 with the stable volume flow rate.

<Method of Manufacturing Semiconductor Device>

A method of manufacturing a semiconductor device according to the present embodiment is performed by using the substrate processing apparatus 100 described above, and may include: a step of heating the process vessel 203; a step of transferring (or loading) the wafer 200 into the process vessel 203; a step of supplying the gas into the process vessel 203; and a step of processing the wafer 200 by using the plasma.

<Program>

Figure 3:
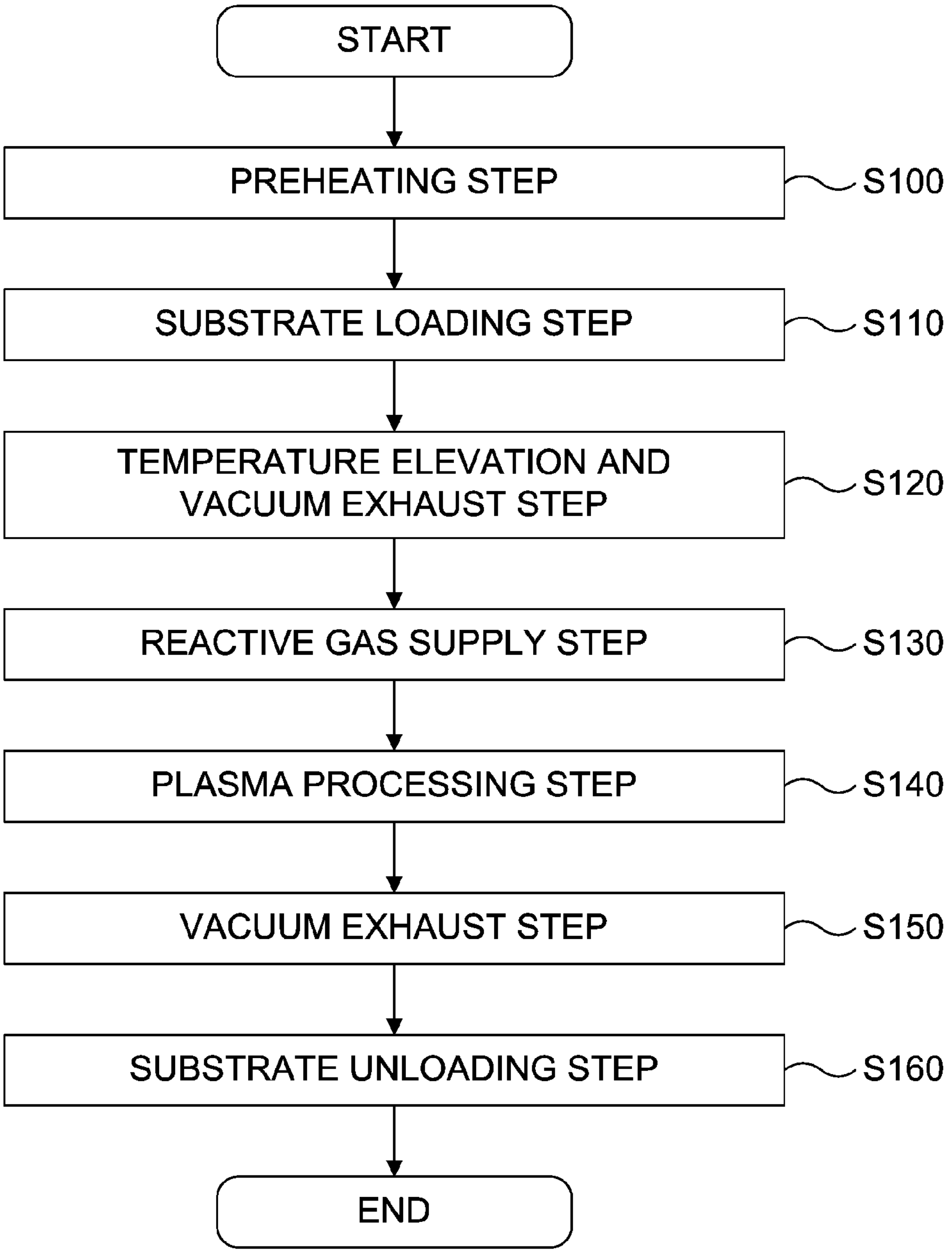
FIG. 3 is a flow chart schematically illustrating a substrate processing according to the embodiment of the present disclosure.

A program according to the present embodiment is a program for manufacturing the semiconductor device by using the substrate processing apparatus 100, and is configured to cause the substrate processing apparatus 100, by the computer, to perform: a procedure of heating the process vessel 203 (for example, a preheating step S100 shown in FIG. 3); a procedure of transferring (or loading) the wafer 200 into the process vessel 203 (for example, a substrate loading step S110 shown in FIG. 3); a procedure of supplying the gas into the process vessel 203 (for example, a reactive gas supply step S130 shown in FIG. 3); and a procedure of processing the wafer 200 by using the plasma (for example, a plasma processing step S140 shown in FIG. 3).

(2) Substrate Processing

Subsequently, the substrate processing according to the present embodiment will be described mainly with reference to FIG. 3. FIG. 3 is a flow chart schematically illustrating the substrate processing according to the present embodiment. The substrate processing according to the present embodiment (which is a part of a manufacturing process of the semiconductor device such as a flash memory) is performed by using the substrate processing apparatus 100 described above. In the following description, operations of components constituting the substrate processing apparatus 100 are controlled by the controller 221.

For example, although not shown, a trench is formed in advance on the surface of the wafer 200 to be processed by the substrate processing according to the present embodiment. In addition, the trench includes a concave-convex portion of a high aspect ratio. According to the present embodiment, for example, an oxidation process serving as a process using the plasma (that is, the substrate processing) is performed to a silicon layer exposed on an inner wall of the trench. For example, the trench is formed by forming a mask layer with a predetermined pattern on the wafer 200 and etching the surface of the wafer 200 to a predetermined depth by using the mask layer.

<Preheating Step (Pre-treatment Step) S100>

First, before loading the wafer 200 into the process chamber 201, a pre-treatment step of pre-heating components in the process chamber 201 or the process vessel 203 is performed. Specifically, by heating the heater 217*b* to a predetermined temperature, the susceptor 217 and the process vessel 203 are heated to the predetermined temperature. When heating the susceptor 217 and the process vessel 203, the damper 1004 is opened to a predetermined opening degree based on the predetermined differential pressure, and an operation control of the fan 1010 is started so as to obtain the predetermined differential pressure (that is, an exhaust of the gas flow path 1000 is started) Since the blower 1020 is the common exhaust equipment, an exhaust operation of the blower 1020 has been continued before the present step.

After a heating by the heater 217*b* is started, the heating and the exhaust of the gas flow path 1000 are continuously performed, and when the temperature of the process vessel 203 is stabilized, a processing of the wafer 200 is started. Even after the start of the processing of the wafer 200 (that is, after the substrate loading step S110), the heating by the heater 217*b* and the exhaust of the gas flow path 1000 are continuously performed at least until a plasma processing (that is, the plasma processing step S140) is completed.

Further, as a structure capable of heating components such as the process vessel 203, in addition to or instead of using the heater 217*b*, the process vessel 203 may also be heated by supplying the high frequency power from the high frequency power supply 273 to the resonance coil 212 to generate the plasma in the process vessel 203.

<Substrate Loading Step S110>

First, the wafer 200 is transferred (or loaded) into the process chamber 201 and accommodated therein. Specifically, the susceptor 217 is lowered to a position of transferring the wafer 200 by the susceptor elevator 268 such that the wafer lift pins 266 pass through the through-holes 217*a* of the susceptor 217. As a result, the wafer lift pins 266 protrude from the through-holes 217*a* by a predetermined height above a surface of the susceptor 217.

Subsequently, the gate valve 244 is opened, and the wafer 200 is transferred into the process chamber 201 using the wafer transfer structure (not shown) from a vacuum transfer chamber (not shown) provided adjacent to the process chamber 201. The wafer 200 loaded into the process chamber 201 is placed on and supported by the wafer lift pins 266 (which protrude from the surface of the susceptor 217) in a horizontal orientation. After the wafer 200 is loaded into the process chamber 201, the wafer transfer structure is retracted to a position outside the process chamber 201, and the gate valve 244 is closed to hermetically seal (or close) an inside of the process chamber 201. Thereafter, by elevating the susceptor 217 using the susceptor elevator 268, the wafer 200 is placed on and supported by an upper surface of the susceptor 217.

<Temperature Elevation and Vacuum Exhaust Step S120>

Subsequently, a temperature of the wafer 200 loaded into the process chamber 201 is elevated. The heater 217*b* is heated in advance, and the wafer 200 is heated to a predetermined temperature (for example, a temperature within a range from 150° C. to 750° C.) by placing the wafer 200 on the susceptor 217 where the heater 217*b* is embedded. Further, while the wafer 200 is being heated, the vacuum pump 246 vacuum-exhausts an inner atmosphere of the process chamber 201 through the gas exhaust pipe 231 such that an inner pressure of the process chamber 201 reaches and is maintained at a predetermined pressure. The vacuum pump 246 is continuously operated at least until a substrate unloading step S160 described later is completed.

<Reactive Gas Supply Step S130>

Subsequently, as a supply of the reactive gas, a supply of the oxygen-containing gas and a supply of the hydrogen-containing gas into the process chamber 201 are started. Specifically, the valves 253*a* and 253*b* are opened to start the supply of the oxygen-containing gas and the supply of the hydrogen-containing gas into the process chamber 201 while flow rates of the oxygen-containing gas and the hydrogen-containing gas are adjusted by the MFCs 252*a* and 252*b*, respectively. In the reactive gas supply step S130, for example, the flow rate of the oxygen-containing gas is adjusted (or set) to a predetermined value within a range from 20 sccm to 2,000 sccm. In addition, for example, the flow rate of the hydrogen-containing gas is adjusted (or set) to a predetermined value within a range from 20 sccm to 1,000 sccm. Further, the inner atmosphere of the process chamber 201 is exhausted by adjusting the opening degree of the APC valve 242 such that the inner pressure of the process chamber 201 reaches and is maintained at a predetermined pressure within a range from 1 Pa to 250 Pa. While appropriately exhausting the inner atmosphere of the process chamber 201 as described above, the oxygen-containing gas and the hydrogen-containing gas are continuously supplied into the process chamber 201 until the plasma processing step S140 described later is completed.

For example, as the oxygen-containing gas, a gas such as oxygen ($O_2$) gas, nitrous oxide ($N_2O$) gas, nitrogen monoxide (NO) gas, nitrogen dioxide ($NO_2$) gas, ozone ($O_3$) gas, water vapor ($H_2O$) gas, carbon monoxide (CO) gas and carbon dioxide ($CO_2$) gas may be used. One or more of the gases described above may be used as the oxygen-containing gas.

In addition, for example, as the hydrogen-containing gas, a gas such as hydrogen ($H_2$) gas, deuterium ($D_2$) gas, the $H_2O$ gas and ammonia ($NH_3$) gas may be used. One or more of the gases described above may be used as the hydrogen-containing gas. When the $H_2O$ gas is used as the oxygen-containing gas, it is preferable that a gas other than the $H_2O$ gas is used as the hydrogen-containing gas. In addition, when the $H_2O$ gas is used as the hydrogen-containing gas, it is preferable that a gas other than the $H_2O$ gas is used as the oxygen-containing gas.

For example, as the inert gas, nitrogen ($N_2$) gas may be used. In addition, a rare gas such as argon (Ar) gas, helium (He) gas, neon (Ne) gas and xenon (Xe) gas may be used as the inert gas. For example, one or more of the gases described above may be used as the inert gas.

<Plasma Processing Step S140>

When the inner pressure of the process chamber 201 is stabilized, a supply of the high frequency power to the resonance coil 212 is started from the high frequency power supply 273.

Thereby, a high frequency electric field is formed in the plasma generation space 201*a* to which the oxygen-containing gas and the hydrogen-containing gas are supplied. As a result, a donut-shaped induction plasma whose plasma density is the highest at a height corresponding to an electrical midpoint of the resonance coil 212 in the plasma generation space 201*a* is excited by the high frequency electric field. Each of the oxygen-containing gas and the hydrogen-containing gas is excited into a plasma state and dissociates. As a result, reactive species such as oxygen radicals containing oxygen (oxygen active species), oxygen ions, hydrogen radicals containing hydrogen (hydrogen active species) and hydrogen ions can be generated.

The radicals generated by the induction plasma and non-accelerated ions are uniformly supplied into the trench of the wafer 200 placed on the susceptor 217 in the substrate processing space 201*b*. Then, the radicals and the ions uniformly supplied into the trench of the wafer 200 react with a layer (for example, the silicon layer) formed on a surface of the inner wall of the trench. Thereby, the layer formed on the surface of the inner wall of the trench is modified into an oxide layer (for example, a silicon oxide layer) whose step coverage is good.

After a predetermined process time (for example, 10 seconds to 300 seconds) has elapsed, the supply of the high frequency power from the high frequency power supply 273 is stopped to stop a plasma discharge in the process chamber 201. In addition, the valves 253*a* and 253*b* are closed to stop the supply of the oxygen-containing gas and the supply of the hydrogen-containing gas into the process chamber 201. Thereby, the plasma processing step S140 is completed.

<Vacuum Exhaust Step S150>

After the supply of the oxygen-containing gas and the supply of the hydrogen-containing gas are stopped, the inner atmosphere of the process chamber 201 is vacuum-exhausted through the gas exhaust pipe 231. Thereby, a gas such as the oxygen-containing gas, the hydrogen-containing gas and an exhaust gas generated from a reaction therebetween in the process chamber 201 can be exhausted out of the process chamber 201. Thereafter, the opening degree of the APC valve 242 is adjusted such that the inner pressure of the process chamber 201 is adjusted to substantially the same pressure as that of the vacuum transfer chamber (to which the wafer 200 is to be transferred: not shown) provided adjacent to the process chamber 201.

<Substrate Unloading Step S160>

After the inner pressure of the process chamber 201 is adjusted to a predetermined pressure, the susceptor 217 is lowered to the position of transferring the wafer 200 until the wafer 200 is supported by the wafer lift pins 266. Then, the gate valve 244 is opened, and the wafer 200 is transferred (unloaded) out of the process chamber 201 by using the wafer transfer structure (not shown). Thereby, the substrate processing according to the present embodiment is completed.

Other Embodiments of Present Disclosure

While the technique of the present disclosure is described in detail by way of the embodiments described above, the technique of the present disclosure is not limited thereto. For example, the embodiments described above are described by way of an example in which the oxidation process or a nitridation process is performed onto the surface of the wafer (substrate) by using the plasma. However, the technique of the present disclosure is not limited thereto. For example, the technique of the present disclosure may be applied to other processing techniques of processing the substrate by using the plasma. For example, the technique of the present disclosure may be applied to a process such as a modification process onto a film formed on the surface of the substrate, a doping process, a reduction process of an oxide film, an etching process with respect to the film and an ashing process for a photoresist, which are performed by using the plasma.

According to some embodiments of the present disclosure, it is possible to stably maintain the temperature of the process vessel by exhausting the space around the process vessel with a stable volume flow rate.

What is claimed is:

1. A substrate processing apparatus comprising: a process vessel in which a substrate is processed; an outer vessel configured to cover an outer circumference of the process vessel; a gas flow path provided between the outer vessel and the outer circumference of the process vessel; an exhaust path in communication with the gas flow path; an adjusting valve configured to adjust a conductance of the exhaust path; a first exhaust apparatus provided on the exhaust path downstream of the adjusting valve; a second exhaust apparatus connected to a downstream side of the exhaust path; a pressure sensor configured to measure an inner pressure of the outer vessel; and a controller configured to adjust an exhaust volume flow rate of the first exhaust apparatus by controlling the first exhaust apparatus based on a pressure measured by the pressure sensor such that a differential pressure between the pressure measured by the pressure sensor and an atmospheric pressure is adjusted to a predetermined differential pressure value, wherein a predetermined opening degree is set in the adjusting valve in accordance with the predetermined differential pressure value and an exhaust volume flow rate of the second exhaust apparatus.

2. The substrate processing apparatus of claim 1, further comprising a plasma generator provided along the outer circumference of the process vessel between the outer vessel and the outer circumference of the process vessel, constituted by an electrode to which a high frequency power is supplied, and configured to plasma-excite a gas supplied into the process vessel, wherein the electrode is constituted by a coil wound around the outer circumference of the process vessel.

3. The substrate processing apparatus claim 1, wherein the predetermined opening degree is set to be smaller than a reference degree at which a differential pressure between a pressure measured by the pressure sensor when the first exhaust apparatus is not operated and the atmospheric pressure is equal to the predetermined differential pressure value.

4. The substrate processing apparatus of claim 1, wherein the controller is further configured to control an opening degree of the adjusting valve to the predetermined opening degree in accordance with the predetermined differential pressure value.

5. The substrate processing apparatus of claim 4, wherein the controller is further configured to control the opening degree of the adjusting valve to the predetermined opening degree in accordance with the predetermined differential pressure value and an exhaust volume flow rate of a second exhaust apparatus connected to a downstream side of the exhaust path.

6. The substrate processing apparatus of claim 5, wherein the predetermined opening degree is set to be smaller than a reference degree at which a differential pressure between a pressure measured by the pressure sensor when the first exhaust apparatus is not operated and the atmospheric pressure is equal to the predetermined differential pressure value.

7. The substrate processing apparatus of claim 1, further comprising a temperature sensor configured to measure a temperature of the process vessel, wherein the predetermined differential pressure is set based on the temperature measured by the temperature sensor.

8. The substrate processing apparatus of claim 7, wherein the controller is further configured to control the first exhaust apparatus such that the differential pressure between the pressure measured by the pressure sensor and the atmospheric pressure is adjusted to the predetermined differential pressure value which is set based on the temperature measured by the temperature sensor.

9. The substrate processing apparatus of claim 1, wherein the pressure sensor is provided in the outer vessel between the gas flow path and the exhaust path.

10. The substrate processing apparatus of claim 9, wherein the exhaust path is connected to an upper surface of the outer vessel, and the pressure sensor is provided vertically below the exhaust path within the outer vessel.

11. A method of manufacturing a semiconductor device by using a substrate processing apparatus comprising: a process vessel; an outer vessel configured to cover an outer circumference of the process vessel; a gas flow path provided between the outer vessel and the outer circumference of the process vessel; an exhaust path in communication with the gas flow path; an adjusting valve configured to adjust a conductance of the exhaust path; a first exhaust apparatus provided on the exhaust path downstream of the adjusting valve; a second exhaust apparatus connected to a downstream side of the exhaust path; and a pressure sensor configured to measure an inner pressure of the outer vessel, wherein the method comprising: (a) heating the process vessel; (b) transferring a substrate into the process vessel; and (c) processing the substrate in the process vessel heated in (a), wherein, in (a), an exhaust volume flow rate of the first exhaust apparatus is adjusted based on a pressure measured by the pressure sensor such that a differential pressure between the pressure measured by the pressure sensor and an atmospheric pressure is adjusted to a predetermined differential pressure value, and wherein a predetermined opening degree is set in the adjusting valve in accordance with the predetermined differential pressure value and an exhaust volume flow rate of the second exhaust apparatus.

12. The method of claim 11, wherein (c) comprises plasma-exciting a gas supplied into the process vessel.

13. A non-transitory computer-readable recording medium storing a program that causes a substrate processing apparatus comprising: a process vessel; an outer vessel configured to cover an outer circumference of the process vessel; a gas flow path provided between the outer vessel and the outer circumference of the process vessel; an exhaust path in communication with the gas flow path; an adjusting valve configured to adjust a conductance of the exhaust path; a first exhaust apparatus provided on the exhaust path downstream of the adjusting valve; a second exhaust apparatus connected to a downstream side of the exhaust path; and a pressure sensor configured to measure an inner pressure of the outer vessel, by a computer, to perform: (a) heating the process vessel; (b) transferring a substrate into the process vessel; and (c) processing the substrate in the process vessel heated in (a), wherein, in (a), an exhaust volume flow rate of the first exhaust apparatus is adjusted based on a pressure measured by the pressure sensor, such that a differential pressure between the pressure measured by the pressure sensor and an atmospheric pressure is adjusted to a predetermined differential pressure value, wherein a predetermined opening degree is set in the adjusting valve in accordance with the predetermined differential pressure value and an exhaust volume flow rate of the second exhaust apparatus.

14. The non-transitory computer-readable recording medium of claim 13, wherein (c) comprises plasma-exciting a gas supplied into the process vessel.

15. The substrate processing apparatus of claim 2, wherein the outer vessel is configured to cover an upper portion of the process vessel, and is constituted by a shield plate configured to shield an electric field outside of the coil, and wherein the exhaust path is configured to be connected to a center of a ceiling portion of the outer vessel.

16. The substrate processing apparatus of claim 2, wherein a gas flowing in the gas flow path is configured to flow between the outer vessel and the outer circumference of the process vessel, and between the coil provided so as to be wound around the outer circumference of the process vessel and the outer vessel, and between the coil and the outer circumference of the process vessel.

* * * * *